(12) United States Patent
Mathieu et al.

(10) Patent No.: US 7,325,302 B2
(45) Date of Patent: Feb. 5, 2008

(54) METHOD OF FORMING AN INTERCONNECTION ELEMENT

(75) Inventors: Gaetan L. Mathieu, Varennes (CA); Benjamin N. Eldridge, Danville, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/440,145

(22) Filed: May 23, 2006

(65) Prior Publication Data

US 2006/0211278 A1   Sep. 21, 2006

Related U.S. Application Data

(62) Division of application No. 10/715,683, filed on Nov. 17, 2003, now Pat. No. 7,048,548, which is a division of application No. 09/473,414, filed on Dec. 28, 1999, now Pat. No. 6,827,584.

(51) Int. Cl.
    *H01R 43/16* (2006.01)
(52) U.S. Cl. .............. 29/874; 29/842; 29/843; 29/884; 29/885; 257/E23.021; 257/E23.078; 439/66; 439/91
(58) Field of Classification Search .......... 29/874, 29/842, 843, 884, 885; 257/E23.021, E23.078; 439/66, 91
    See application file for complete search history.

(56) References Cited

U.S. PATENT DOCUMENTS

| | | | |
|---|---|---|---|
| 3,781,683 A | 12/1973 | Freed | |
| 3,849,872 A | 11/1974 | Hubacher | |
| 4,418,857 A | 12/1983 | Ainslie et al. | |
| 4,553,192 A | 11/1985 | Babuke et al. | |
| 5,307,311 A | 4/1994 | Silwa, Jr. | |
| 5,442,282 A | 8/1995 | Rostoker | |

(Continued)

FOREIGN PATENT DOCUMENTS

DE    3604021 A1    8/1986

(Continued)

OTHER PUBLICATIONS

U.S. Appl. No. 09/547,561, filed Apr. 12, 2000, Mathieu et al.

(Continued)

*Primary Examiner*—A. Dexter Tugbang
*Assistant Examiner*—Tim Phan
(74) *Attorney, Agent, or Firm*—N. Kenneth Burraston

(57) ABSTRACT

A method of forming an interconnection element. In one embodiment, the interconnection element includes a first structure and a second structure coupled to the first structure. The second structure coupled with the first material has a spring constant greater than the spring constant of the first structure alone. In one embodiment, the interconnection element is adapted to be coupled to an electronic component tracked as a conductive path from the electronic component. In one embodiment, the method includes forming a first (interconnection) structure coupled to a substrate to define a shape suitable as an interconnection in an integrated circuit environment and then coupling, such as by coating, a second (interconnection) structure to the first (interconnection) structure to form an interconnection element. Collectively, the first (interconnection) structure and the second (interconnection) structure have a spring constant greater than a spring constant of the first (interconnection) structure.

13 Claims, 9 Drawing Sheets

U.S. PATENT DOCUMENTS

| | | |
|---|---|---|
| 5,476,211 A | 12/1995 | Khandros |
| 5,495,667 A | 3/1996 | Farnworth et al. |
| 5,506,499 A | 4/1996 | Puar |
| 5,613,861 A | 3/1997 | Smith et al. |
| 5,665,648 A | 9/1997 | Little |
| 5,772,451 A | 6/1998 | Dozier, II et al. |
| 5,810,609 A | 9/1998 | Faraci et al. |
| 5,829,128 A | 11/1998 | Eldridge et al. |
| 5,832,601 A | 11/1998 | Eldridge et al. |
| 5,848,685 A | 12/1998 | Smith et al. |
| 5,917,707 A | 6/1999 | Khandros et al. |
| 6,029,344 A | 2/2000 | Khandros et al. |
| 6,150,186 A | 11/2000 | Chen et al. |
| 6,183,267 B1 * | 2/2001 | Marcus et al. ............... 439/66 |
| 6,245,444 B1 | 6/2001 | Marcus et al. |
| 6,442,931 B1 | 9/2002 | Khandros et al. |
| 6,482,013 B2 | 11/2002 | Eldridge et al. |
| 6,590,267 B1 * | 7/2003 | Goodwin-Johansson et al. 257/415 |
| 6,640,432 B1 | 11/2003 | Mathieu et al. |
| 6,827,584 B2 | 12/2004 | Mathieu et al. |
| 7,048,548 B2 | 5/2006 | Mathieu et al. |
| 2001/0012704 A1 | 8/2001 | Eldridge et al. |
| 2004/0038560 A1 | 2/2004 | Mathieu et al. |

FOREIGN PATENT DOCUMENTS

| | | |
|---|---|---|
| JP | 4-240570 | 8/1992 |
| JP | 9-213183 | 8/1997 |
| WO | WO 97/44676 | 11/1997 |
| WO | WO 98/52224 | 11/1998 |

OTHER PUBLICATIONS

Weast, "Handbook Of Chemistry And Physics," pp. D-171 and D-172.

* cited by examiner

METHOD OF FORMING AN INTERCONNECTION ELEMENT

CROSS-REFERENCE TO RELATED APPLICATIONS

This application is a divisional of U.S. patent application Ser. No. 10/715,683, filed on Nov. 17, 2003 (U.S. Pat. No. 7,048,548, issued May 23, 2006), which is a divisional of 09/473,414, filed on Dec. 28, 1999 (U.S. Pat. No. 6,827,584, issued Dec. 7, 2004).

BACKGROUND OF THE INVENTION

1. Field of the Invention

The invention relates to an interconnection element suitable for effective pressure connections between electronic components.

2. Description of Related Art

Interconnection or contact elements may be used to connect devices of an electronic component or one electronic component to another electronic component. For example, an interconnection element may be used to connect two circuits of an integrated circuit chip or to connect an application specific integrated circuit (ASIC) to another component such as a printed circuit board. Interconnection elements may also be used to connect the integrated circuit chip to a chip package suitable for mounting on a printed circuit board of a computer or other electronic device. Interconnection elements may further be used to connect the integrated circuit chip to a test device such as a probe card assembly or other printed circuit board (PCB) to test the chip.

Generally, interconnection or contact elements between electronic components can be classified into at least the two broad categories of "relatively permanent" and "readily demountable."

An example of a "relatively permanent" contact element is a wire bond. Once two electronic components are connected to one another by a bonding of an interconnection element to each electronic component, a process of unbending must be used to separate the components. A wire bond interconnection element, such as between an integrated circuit chip or die and inner leads of a chip or package (or inner ends of lead frame fingers) typically utilizes a "relatively permanent" interconnection element.

One example of a "readily demountable" interconnection element is the interconnection element between rigid pins of one electronic component received by resilient socket elements of another electronic component, for example, a spring-loaded LGA socket or a zero-insertion force socket. A second type of a "readily demountable" interconnection element is an interconnection element that itself is resilient or spring-like or mounted in or on a spring or resilient medium. An example of such an interconnection element is a tungsten needle of a probe card. The interconnection element of a probe card is typically intended to effect a temporary pressure connection between an electronic component to which the interconnection element is mounted and terminals of a second electronic component, such as a semiconductor device under test.

With regard to spring interconnection elements, generally, a minimum contact force is desired to effect reliable pressure connection to an electronic component (e.g., to terminals of an electronic component). For example, a contact (load) force of approximately 15 grams (including as little as 2 grams or less and as much as 150 grams or more, per terminal) may be desired to effect a reliable electrical pressure connection to a terminal of an electronic component.

A second factor of interest with regard to spring interconnection elements is the shape and metallurgy of the portion of the interconnection element making pressure connection to the terminal of the electronic component. With respect to the tungsten needle as a spring interconnection element, for example, the contact end is limited by the metallurgy of the element (i.e., tungsten) and, as the tungsten needle is made smaller in diameter, it becomes commensurately more difficult to control or establish a desired shape at the contact end.

In certain instances, spring interconnection elements themselves are not resilient, but rather are supported by a resilient membrane. Membrane probes exemplify this situation, where a plurality of microbumps are disposed on a resilient membrane. Again, the technology required to manufacture such contact elements limits the design choices for the shape and metallurgy of the contact portion of the contact elements.

Commonly-owned U.S. patent application Ser. No. 09/152,812 filed Nov. 16, 1993 (now U.S. Pat. No. 5,476,211, issued Dec. 19, 1995), and its counterpart commonly-assigned divisional U.S. patent application Ser. No. 09/397,779, filed Sep. 16, 1999, titled "Electronic Assembly Comprising a Substrate and a Plurality of Springable Interconnection Elements Secured to Terminals of the Substrate," and U.S. patent application Ser. No. 09/245,499, filed Feb. 5, 1999, by Khandros, titled "Method of Manufacturing Raised Electrical Contact Pattern of Controlled Geometry," disclose methods for making spring interconnection elements. In a preferred embodiment, these spring interconnection elements, which are particularly useful for microelectronic applications, involve mounting an end of a flexible elongate element (e.g., wire "stem" or "skeleton") to a terminal on an electronic component, and coating the flexible element and adjacent surface of the terminal with a "shell" of one or more materials. One of skill in the art can select a combination of thickness, yield strength, and elastic modulus of the flexible element and shell materials to provide satisfactory force-to-deflection characteristics of the resulting spring interconnection elements. Exemplary materials for the core element include gold. Exemplary materials for the coating include nickel and its alloys. The resulting spring interconnection element is suitably used to effect pressure, or demountable, interconnections between two or more electronic components, including semiconductor devices.

As electronic components get increasingly smaller and the spacing between terminals on the electronic components get increasingly tighter or the pitch gets increasingly finer, it becomes increasingly more difficult to fabricate interconnections including spring interconnection elements suitable for making electrical connection to terminals of an electronic component. Co-pending and commonly-assigned U.S. patent application Ser. No. 08/802,054, titled "Microelectronic Contact Structure, and Method of Making Same," discloses a method of making spring interconnection elements through lithographic techniques. In one embodiment, that application discloses forming a spring interconnection element (including a spring interconnection element that is a cantilever beam) on a sacrificial substrate and then transferring and mounting the interconnection element to a terminal on an electronic component. In that disclosure, the spring interconnection element is formed in the substrate itself through etching techniques. In co-pending, commonly-assigned U.S. patent application Ser. No. 08/852,152, titled "Microelectronic Spring Contact Elements," spring interconnection elements are formed on a substrate, including a substrate that is an electronic component, by depositing and patterning a plurality of masking layers to form an opening corresponding to a shape embodied for the spring interconnection element, depositing conductive material in the opening made by the patterned masking layers, and removing the masking layers to form the free-standing spring interconnection element.

Co-pending and commonly-assigned U.S. patent application Ser. No. 09/023,859, titled "Microelectronic Contact Structures and Methods of Making Same," describes an interconnection element having a base end portion (post component), a body portion (beam component) and a contact end portion (tip component) and methods separately forming each portion and joining the post portion together as desired on an electronic component.

U.S. Pat. No. 5,613,861 (and its counterpart divisional U.S. Pat. No. 5,848,685), issued to Smith et al. disclose photolithographically patterned spring interconnection elements formed on a substrate with a body having an inherent stress gradient formed of a resilient (e.g., elastic) material such as chrome-molybdenum alloy or a nickel-zirconium alloy. The stress gradient causes an end of the body to bend away from the substrate in the shape of an arc when the end is freed from the substrate.

In order to achieve the desired shape of the body, the thickness of the interconnection element described in U.S. Pat. No. 5,613,861 must be limited. A limit on the thickness of the interconnection element limits the spring constant, k, of the interconnection element (kœthickness), particularly in state-of-the-art interconnection element arrays where the dimensions (e.g., length and width) of individual interconnection arrays are reduced to accommodate a corresponding increase in contact pad or terminal density. A reduction of the spring constant generally reduces the amount of load or force, F, that may be applied to resilient interconnection elements for a given deflection, x (k=F/x). Thus, such interconnection elements generally cannot sustain the minimum contact force necessary to effect reliable pressure contact to an electronic component.

What is needed is a resilient interconnection element and a method of improving the resiliency of an interconnection element, particularly interconnection elements that are suitable for present fine-pitch electrical connections and that is/are scalable for future technologies. Also needed are improved methods of making resilient interconnection elements, particularly methods that are repeatable, consistent, and inexpensive.

SUMMARY OF THE INVENTION

An interconnection element is disclosed. In one embodiment, the interconnection element includes a first structure of a first material having a first spring constant and a second structure of a second material coupled to the first material. The first structure is capable of being free-standing by itself and the first spring constant is high enough for repeated elastic displacement without substantial plastic deformation. The second structure can be of lithographically-patterned second material. Collectively, the first material and the second material have a spring constant greater than the first spring constant. In one embodiment, the interconnection element is adapted to be coupled to an electronic component to act as a conductive path for the electronic component.

According to the invention, the spring constant of an interconnection element can be increased by coupling (e.g., coating) a second material over the first material. The first material is, for example, a body of the interconnection element formed to have some measurable amount of resiliency. The interconnection element of the invention increases this resiliency by coupling a second material that itself comprises resilient properties. The second material may also be used to increase the spring constant of a resilient interconnection. An increased spring constant permits the interconnection element of the invention to sustain a desired contact force to effect reliable pressure contact to an electronic component, making the interconnection element suitable for use in a variety of applications, including as part of a densely-packed array of interconnection elements on an electronic component to couple to a corresponding array of contact pads or terminals on a second electronic component. The addition of the second structure to the first structure will generally increase the working force for a given deflection, but may decrease the deflection required to permanently deform the interconnection element. The addition of the second structure may also increase or decrease the longevity of the interconnection element for a number of compression cycles to failure of the interconnection element, depending on the material properties of the structure material. In general, the ratios of the yield stress, a, and elastic modulus, E, of the two structures along with the thickness of the structures (and the total thickness of the interconnection element) will determine the final outcome.

A method is also disclosed. In one embodiment, the method includes forming a first structure coupled to a substrate, the first structure comprising an internal stress to define a shape suitable as an interconnection in an integrated circuit environment and coupling, such as by coating, a second structure to the first structure to form an interconnection element. Collectively, the first structure and the second structure have a strength greater than a strength of the first structure material when used alone as an interconnection element.

The method of the invention addresses, in one aspect, enhancing the spring constant of a resilient interconnection element to make the interconnection element suitable for use in an integrated circuit environment to act as a conductive path from an electronic component. By coupling (e.g., coating) a second structure to the first structure to improve the spring constant of an interconnection element, the method of the invention addresses the limitations of the interconnection elements formed in certain disclosures presented in the prior art.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION OF THE INVENTION

Figure 1:
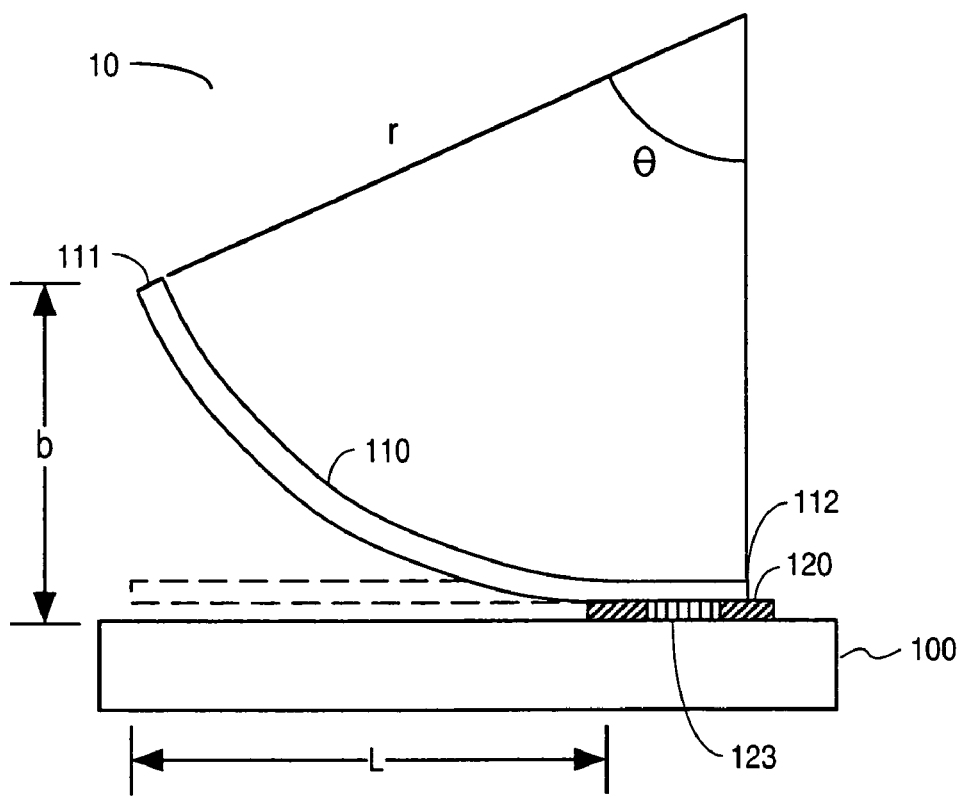
FIG. 1 illustrates an interconnection element having a measurable spring constant in an undeformed free state in accordance with an embodiment of the invention.

The invention relates to interconnection elements, including contact elements. According to one aspect of the invention, the invention contemplates an interconnection element with improved spring properties over prior art interconnection elements. In another aspect, the invention relates to improving the spring constant of prior art interconnection elements through the coupling of additional resilient material(s) to an existing interconnection element. In the either aspect, the invention describes an improved interconnection element over prior art interconnection elements thus improving the suitability of the interconnection element of the invention for use in present and future, reduced-sized applications, including providing a conductive path between electronic components such as in contacting and/or testing of contact pads or terminals of an electronic component.

Suitable electronic components include, but are not limited to, an active semiconductor device made of any suitable semiconductor material such as silicon (Si) or gallium-arsenide (GaAs), a memory chip, a portion of a semiconductor wafer, a ceramic substrate, an organic substrate, a printed circuit board (PCB), an organic membrane, a polyimide sheet, a space transformer, a probe card, a chip carrier, production interconnect sockets, test sockets, sacrificial members, semiconductor packages, including ceramic and plastic packages, chip carriers, and connectors. The electronic component may be an active device or a passive device that supports one or more electronic connections. The electronic component includes substrates having one or more signal lines distributed throughout the substrate, such as a ceramic, or organic substrate having a plurality of conductive signal lines. distributed in individual layers of the substrate and supporting electronic connection to one or more signal lines through contact pads or terminals exposed, for example, on the substrate. In general, suitable electronic components include, but are not limited to, devices comprising an integrated circuit having at least two contact pads or terminals providing electrical access to the circuit. Such a device is representatively demonstrated by an integrated circuit chip (or microchip) having a plurality of exposed contact pads or terminals providing access to the integrated circuit of the device.

The interconnection element of the invention may be fabricated on or independent of the electronic component to which it is joined. In the case of independent fabrication, the invention contemplates that the interconnection element or elements can be fabricated with a shape, size, and metallurgy that are not limited by the materials and layout considerations associated with the manufacture of the electronic component. Independent fabrication also avoids the exposure of the electronic component to the process conditions associated with forming the interconnection element.

In one embodiment, the interconnection elements of the invention are introduced on an electronic component (e.g., to contact pads or terminals) that is a semiconductor die or chip, preferably before the die or chip is singulated (separated) from a semiconductor wafer. In this manner, a plurality of unsingulated semiconductor dies can be exercised (tested and/or "burned in") prior to the dies being singulated. The interconnection elements can be configured to make releasable (i.e., temporary) electrical connection to, for example, the testing device, such as a probe card assembly. Such interconnection elements can also be configured to be suitable for socketing (one form of releasable connection) electronic components, such as for performing burn-in of a die.

According to one aspect of the invention, the interconnection elements that are mounted to the dies and that are used to exercise the dies can be used to make permanent connections to the dies after they have been singulated. In this manner, it is to be appreciated that the interconnection elements of the invention are suitable for die- or chip-scale packaging, for instance, to facilitate the connection of the die or chip to a printed circuit board (PCB) together with or in the absence of a die package. A detailed discussion of die- or chip-scale mounting, exercising, and packaging is presented in commonly-owned U.S. patent application Ser. No. 08/558,332, filed Nov. 15, 1995, titled "Method of Mounting Resilient Contact Structures to Semiconductor Devices," (now U.S. Pat. No. 5,829,128, issued Nov. 3, 1998) which is incorporated herein by reference. For example, the interconnection elements of the invention are suitable for mounting directly to semiconductor devices, such as contact pads on a semiconductor die, for connection with other semiconductor devices or with suitable other electronic components (e.g., PCBs, modules, etc.).

Disposed on an electronic component such as a space transformer of a probe card assembly, the interconnection elements of the invention are designed to accommodate contact pads or terminals of electronic components having very small pitch or spacing tolerances. In one embodiment, the interconnection elements of the invention adopt alternating orientation (e.g., left-right-left-right) so as to achieve a greater pitch between their post portion than at the tip portion. In another embodiment, the interconnection elements of the invention adopt alternating lengths (e.g., short-long-short-long) so as to achieve a greater pitch between a post or anchor portion than at the tip portion of adjacent interconnection elements. Similarly, alternating interconnection elements can be fabricated to have a greater pitch at their tip portions than their post or anchor portions. In summary, the interconnection elements, whether fabricated on or independent of the electronic component to which they are joined may adopt a variety of orientations to accommodate various configurations associated with the electronic components to which they connect.

FIG. 1 shows a cross-sectional side view of structure 10 having, for example, a plurality of spring interconnection elements similar to spring interconnection element 110. A similar interconnection element is illustrated and described in U.S. Pat. No. 5,613,861 issued to Smith et al. Reference is made to that patent for a detailed explanation of the formation of the interconnection element. The referenced patent described the final structure as a spring contact or interconnection element. In the instant description, such a structure as described in the referenced patent will be used as a starting point for forming an improved or enhanced interconnection element. It is to be appreciated at this point that, as one starting point, an interconnection element or interconnection element precursor, including but not limited to the interconnection element described in the referenced patent, that has, in one sense, some measurable spring constant is suitable for use in forming the improved interconnection element of the invention.

Interconnection element 110 of FIG. 1 comprises free portion 111 and anchor portion 112 fixed, in this embodiment, to insulating underlayer 120 and electrically connected to contact pad 123. It is to be appreciated that, depending on the application, anchor portion 112 of interconnection element 110 may be fixed to either or both of insulating underlayer 120 and contact pad 123. In another embodiment contemplated by the invention, the contact pads of an electronic component may be redistributed from one arrangement to, for example, a set of contact pads having a different arrangement and/or geometry. In such a redistribution, a layer of, for example, copper, titanium, titanium-tungsten, or other metallization may be applied over the surface of substrate 100 and patterned as desired.

Interconnection element 110 is made of a resilient material, such as a chrome-molybdenum alloy or a nickel-zirconium alloy. In one embodiment, interconnection element 110 is formed as a conductive material, although it is to be appreciated that the precursor can be formed of a non-conductive or semi-conductive material provided, in an application such as where the ultimate interconnection element formed from the precursor is used as a conductive path, the interconnection element is coated or plated with a conductive material at some point.

In one embodiment, contact pad 123 is the terminal end of a communication line that electrically communicates with an electronic device formed-on substrate 100. In another embodiment, contact pad 123 electrically communicates with a corresponding electronic component that is electrically mated with free portion 111 of interconnection element 110. Suitable electronic devices include, but are not limited to, a transistor, a display electrode, or other electrical device.

Contact pad 123 is typically made of an aluminum material, but can be made of other conductive materials.

Insulating underlayer 120 is, for example, silicon nitride or other patternable insulating material. It is to be appreciated that insulating underlayer 120 is not necessary and can be eliminated. Insulating underlayer 120 and contact pad 123 are formed on or over substrate 100 that is, for example, a semiconductor material, a ceramic material, an insulating material, a polymerizable (e.g., organic) material, or a combination of such materials.

Referring to the structure described in U.S. Pat. No. 5,613,861, interconnection element 110 is formed such that a stress gradient, $\Delta\sigma/h$, is introduced into interconnection element 110. When interconnection element 110 is formed of, for example, one of the noted suitable conductive materials, the conductive material comprising interconnection element 110 is deposited such that tensile stress is present in superiorly-located portions (relative to the surface of substrate 100) of the conductive material and compressive stress is present in inferiorly-located portions of the conductive material. In other words, in this embodiment, the conductive material of interconnection element 110 is comprised of a plurality of layers. Alternatively, rather than distinct layers, interconnection element 110 may itself have a continuous stress gradient. The stress gradient causes interconnection element 110 to bend into the approximate shape of an arc between free portion 111 and anchored portion 112 with free portion 111 curved away from substrate 100. The approximate shape of an arc in this example has a radius (r). In FIG. 1, theta, $\theta$, is the angle separating the radius line directed toward anchor portion 112 and the radius line directed toward free portion 111. The following equation gives the approximate height, b, of free portion 111 of interconnection element 110 from substrate 100 for angles $\theta < 50°$:

$$b = L^2/2r.$$

L is the length of free portion 111 and r is the radius of curvature of free portion 111. One suitable height of interconnection element 110 from the surface of substrate 100 to the end of free portion 111 is approximately 6-8 mils (150-200 μm).

Since interconnection element 110 is made of a resilient material, interconnection element 110 can be displaced, in one example, in an inferiorly-directed manner toward substrate 100 at the end or contact region of free portion 111 and deform, but will not plastically deform. In this description, interconnection element 110 is formed on a substrate lying in an x-y plane and the referenced inferiorly-directed force is substantially in a z-direction directed toward the surface of substrate 100 (e.g., "downward"). Typically, a contact pad of an electronic component transfers the downward force at the contact region of free portion 111. Interconnection element 110 resists the downward force placed on the contact region by pushing interconnection element 110 toward its original shape and, in so doing, maintains electrical contact with the contact pad. When the force on the contact region is released, the interconnection element will return to its original (e.g., arc) state, provided the force is not too great to exceed the maximum stress (i.e., yield stress) of the material and permanently deform the precursor.

It should be appreciated that the structure shown in FIG. 1 is one embodiment of an interconnection element with the force applied in an inferior direction toward the surface of substrate 100 by, for example, an electronic component, to displace the interconnection element. In this embodiment, the contact region of interconnection element 110 is the superior surface of the end of interconnection element 110. Interconnection element 110 may alternatively be formed in a variety of shapes having different contact regions, such as illustrated in U.S. patent application Ser. No. 08/844,946, titled "Probe Card Assembly and Kit and Methods of Using the Same." The associated contact force and displacement of such interconnections will similarly vary.

The formation of the interconnection element shown in FIG. 1, and as described in U.S. Pat. No. 5,613,861, begins by forming contact pad 123 on or over substrate 100. Additionally, insulating underlayer 120 is formed on or over substrate 100. As mentioned above, insulating underlayer 120 is not required and can be eliminated.

To form the interconnection element shown in FIG. 1, a layer of conductive material is deposited adjacent substrate 100. As used herein, the deposition adjacent the substrate includes incorporation of the material in the body of the substrate as well as on or over the substate. In one embodiment, the conductive material is a nickel-zirconium alloy. Part of the conductive layer is electrically connected directly to contact pad 123 and another portion of a conductive material is deposited adjacent insulating underlayer 120. It is to be appreciated that there are many methods available for depositing a conductive material such as nickel-zirconium on or over a substrate, including electron-beam deposition, electroplating, thermal evaporation, chemical vapor deposition, sputter deposition, and other methods.

The conductive material of interconnection element 110 can be thought of as deposited in several sub-layers to a final thickness. U.S. Pat. No. 5,613,861 describes several layers of conductive material deposited to a final thickness of approximately one micron. A stress gradient is introduced into interconnection element 110 by altering the stress inherent in each of the sub-layers of the conductive material.

The referenced patent instructs that different stress levels can be introduced into each sub-layer of the conductive material that forms interconnection element 110 in FIG. 1 by using a sputter deposition process. The different stress levels can be introduced in a variety of ways, including adding a reactive gas to the plasma, depositing the metal at an angle, and changing the pressure of the plasma gas. The referenced patent prefers introducing different stress levels by varying the pressure of the plasma gas, such as an argon gas. The patent further describes depositing five sub-layers of the conductive material.

After the conductive material is deposited, photolithographic patterning is employed to pattern interconnection element 110. Photolithographic patterning is a well-known technique routinely used in the semiconductor chip industry. In one example, deposited photosensitive material is spun on top of the conductive material and soft-baked at 90° C. to drive up solvents in the resist. The photosensitive resist is exposed to an appropriate pattern of ultraviolet light and developed. Exposed areas of the resist are removed during developing and the remaining resist is hard-baked at 120° C. Wet or plasma etching is then used to remove the exposed areas of the conductive material. The remaining areas of the conductive material form interconnection element 110 (a "first structure").

Once interconnection element 110 is formed and patterned, free portion 111 of interconnection element 110 is released from the insulating underlayer by a process of under-cut etching. Until free portion 111 is released from insulating underlayer 120, free portion 111 adheres to insulating underlayer 120 and interconnection element 110 lies flat on substrate 100 (indicated in dashed lines). U.S. Pat. No. 5,613,861 describes two methods for releasing free portion 111 from substrate 100. In the first method, insulating underlayer 120 is pre-patterned before conductive layer deposition, into islands on which interconnection elements will be formed. After the interconnection elements are formed on or over the islands of insulating underlayer 120, interconnection elements 110 are released from insulating underlayer 120 by etching the islands with a selective etchant. In the case of an insulating underlayer of silicon nitride, the selective etchant is typically a HF solution.

A second method described in the referenced patent for releasing free portion 111 of interconnection element 110 from insulating underlayer 120 is by depositing a passivating layer, such as silicon oxynitride, on interconnection element 110 and surrounding areas of substrate 100 by plasma enhanced chemical vapor deposition (PECVD). The passivation layer is patterned into windows to expose free portion 111 of interconnection element 110 and surrounding areas of insulating underlayer 120. A selective etchant, such as an HF solution, is used to etch insulating underlayer 120 and release free portion 111 of interconnection element 110.

In this embodiment, only those areas of insulating underlayer 120 and the free portion 111 of interconnection element 110 are under-cut etched. Anchor portion 112 of interconnection element 110 remains fixed to insulating underlayer 120 and does not pull away from insulating underlayer 120.

Once free portion 111 is freed from insulating underlayer 120, the stress gradient of the conductive material sub-layers that make up interconnection element 110 cause free portion 111 to bend away from substrate 100. To discourage anchor portion 112 from pulling away from substrate 100, interconnection element 110 can be annealed.

U.S. Pat. No. 5,613,861 describes a final step of plating a gold layer over the outer surface of interconnection element 110 to reduce the resistance in the interconnection element. The referenced patent describes forming interconnection elements having a width of about 10-100 microns (μm) allowing a spacing of adjacent interconnection elements of approximately 10-20 μm on a substrate. Accordingly, the center-to-center distance between adjacent interconnection elements is calculated to be approximately 20-120 μm, which is within or less than the typical center-to-center distance between adjacent contact pads on the state-of-the-art chip.

As noted above, one problem with the interconnection element formed by the referenced patent is the mechanical properties associated with its small dimensions. In order to accomplish the desired bending (e.g., arcing) away from substrate 100, the thickness of interconnection element 110 formed according to the techniques described in U.S. Pat. No. 5,613,861 is limited. The resiliency of the interconnection element is limited as is the spring constant. In other words, to bend far enough to be useful as an interconnection element, interconnection element 110 must be generally thin, but being thin works against high resilience and against a large spring constant. Thus, the interconnection element described in the referenced patent has limited practical utility for use as an interconnection element to contact pads, such as may be useful in testing of an integrated circuit chip.

The invention contemplates, in one aspect, improving the practical utility of an interconnection element such as described in the U.S. Pat. No. 5,613,861 by improving the spring constant of the interconnection element. FIGS. 2-11 illustrate one process of forming an improved interconnection element according to the invention.

Figure 2:
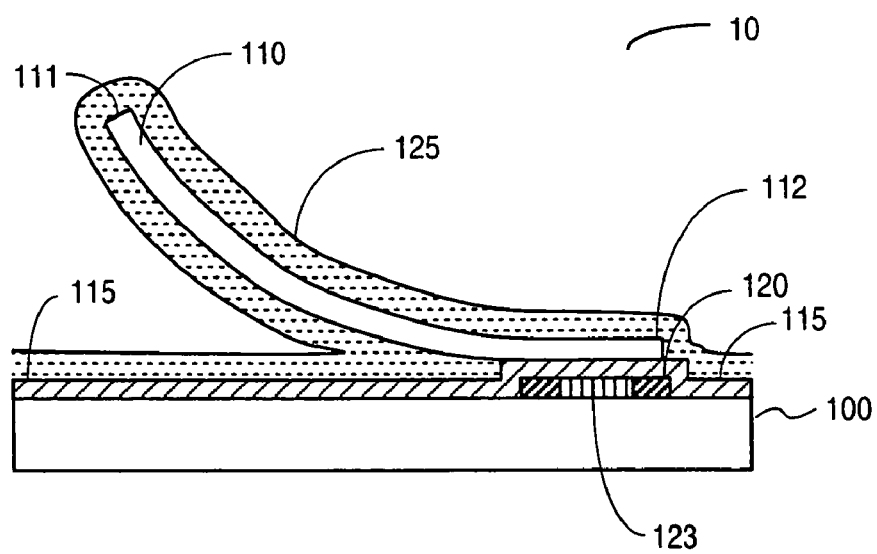
FIG. 2 shows the structure of FIG. 1 after the deposition of a masking material layer over the structure in accordance with an embodiment of the invention.

With reference to FIG. 2, starting from interconnection element 110 formed on a substrate by, for example, the process described in the referenced patent, and, in one embodiment, ignoring the final step of plating a gold layer over the precursor, the invention deposits masking material layer 125 over substrate 100.

One problem with depositing conventional masking materials including conventional photoresist over interconnection element 110, such as the interconnection element formed in the referenced patent, is that overcoating can damage or break the relatively thin (e.g., about 1 micron) and fragile interconnection element. Accordingly, depositing a masking material layer over the interconnection element to pattern an opening on the interconnection element presents a challenge.

A solution to the problem with depositing a masking material over the interconnection element such as interconnection element 110 is depositing a positive electrophoretic resist over the structure. A suitable electrophoretic resist material is commercially available from the Shipley Company of Marlborough, Mass. An electrophoretic resist works by depositing charged particles that form masking material layer 125 between an anode and cathode established about structure 10. As long as the surface of interconnection element 110 is conductive, an electrophoretic resist deposition will deposit particles according to a substantially uniform coating everywhere about substrate 100, including that area between interconnection element 110 and substrate 100. The electrophoretic resist will also not damage a fragile interconnection element.

In one embodiment, prior to the introduction of interconnection element 110, conductive layer 115 of copper, titanium, or titanium-tungsten or other appropriate metal or alloy is introduced to a thickness of, for example, about 3000 Å to 6000 Å, such as about 5000 Å over substrate 100 by, for example, sputtering, to facilitate subsequent electroplating processing, including the introduction of the electrophoretic resist onto substrate 100. Such a conductive layer is particularly advantageous when there is no convenient way to connect through the substrate. Such might be the case when using silicon as a substrate, or certain configurations of ceramic, polyimide, or other materials.

In another embodiment, contact pads on one surface are coupled to contact pads on a second surface. Such a configuration might be utilized in, for example, a multi-layer ceramic or other substrate. In such case, a conductive layer (e.g., shorting layer) may be introduced on the surface opposite the surface selected to accommodate the interconnection element(s) of the invention. The conductive layer connects a plurality of the contact pads to act as a generalized cathode in an electroplating process. Details of materials, thickness, processing variations and the like can be found in co-pending, commonly-owned U.S. patent application Ser. No. 09/032,473, filed Feb. 26, 1998, titled "Lithographically Defined Microelectronic Contact Structures," and PCT equivalent published as WO 98/52224 on Nov. 9, 1998, both of which are incorporated herein by reference.

Figure 3:
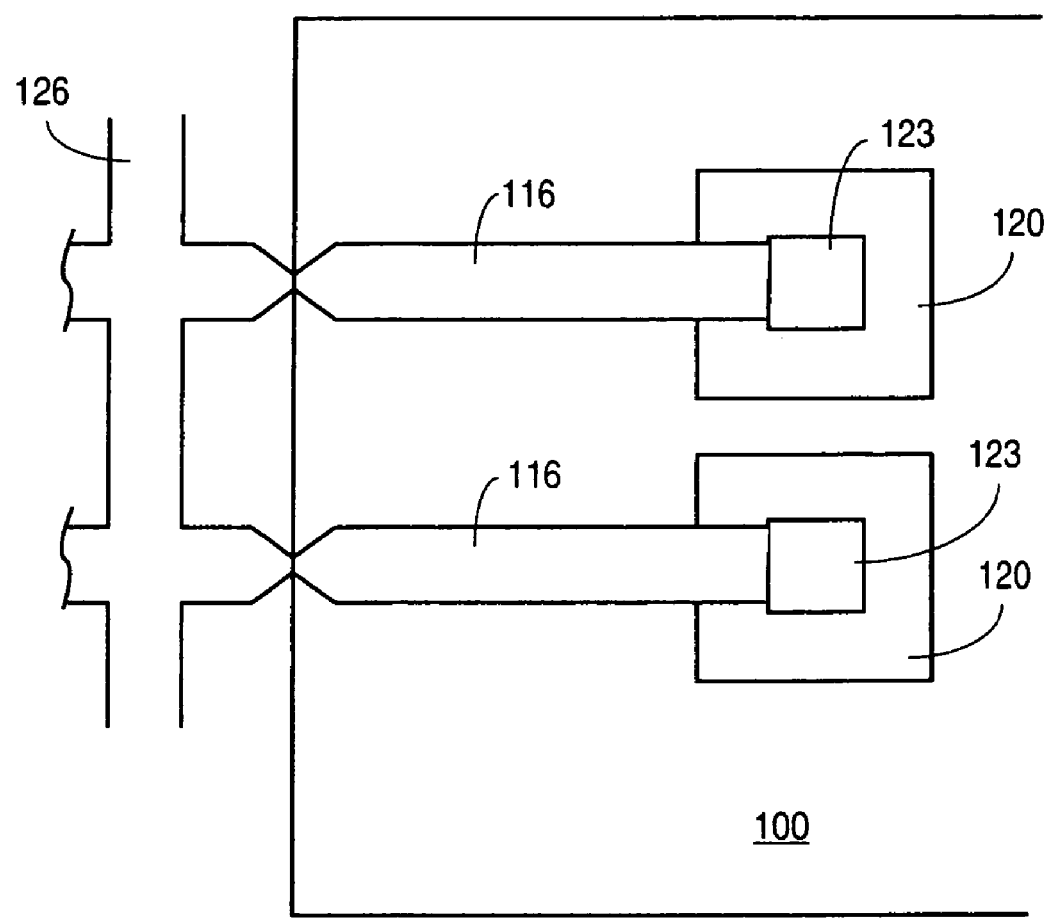
FIG. 3 shows a planar top view of a portion of a wafer including a die having traces formed thereon to a central bus.

A further alternative utilizes a redistribution layer, commonly employed to redistribute a contact pad arrangement as the conductive layer. In one example, contact pad 123 is coupled to a redistribution layer of a routing trace and interconnection element 110 is formed at a position away from contact pad 123. Conductive layer 115 including, in one example, a routing trace maintains electrical contact with contact pad 123 (or a population of contact pads 123) and/or interconnection element(s) 110 until the contact is no longer needed, e.g., after electroplating processes are completed. With respect to conductive layer 115 that is a redistribution layer, there are at least the following options. First, the redistribution layer remains as an intact-layer until late in the process when it is masked and defined to isolate the various traces and interconnection elements. Alternatively, the redistribution layer is patterned into traces that maintain connections to a central bus so that a minimal number of contacts can complete the plating circuit, which in a preferred embodiment is to the interconnection element as cathode. Once the electroplating process(es) that is(are) used to form an interconnection element according to the invention are complete, the connection to the common bus may be severed for example by etching or a mechanical process such as dicing of a wafer. FIG. 3 illustrates a planar top view of such a configuration (with like reference numerals representing like elements). In FIG. 3, traces 116 are patterned from contact pads 123 to central bus 126 outside the edge of a chip or die of a wafer, e.g., in a scribe street. The connections of traces 116 may be severed by dicing the wafer at the scribe street.

With reference to FIG. 2, conductive material 115 is introduced adjacent substrate 100. Interconnection element 110 is then formed as described above over conductive material 115. Insulating underlayer 120 may still be introduced, for example, in area adjacent contact pad 123 to, in one instance, isolate contact pad 123.

With respect to the electrophoretic mask introduction described above, once interconnection element 110 is formed as described above, masking material layer 125 of an electrophoretic resist may then be introduced by way of an electrophoretic deposition process. A suitable thickness for masking material layer 125 that is an electrophoretic resist is about 0.3 to 1 mils (8 to 30 μm). Such a mask is introduced though an electrophoretic process to mask the substrate and expose the superior surface of interconnection element 110.

Another example of a masking material that is suitable for deposition over a relatively thin interconnection element that might otherwise be damaged by traditional deposition processes including spin-on processes, is a spray-on photoresist deposited at a rate that will not damage interconnection element 110. It is to be appreciated that a conductive layer deposited over a portion of the substrate, including the entire substrate, may not be necessary in such a situation particularly where subsequent processing does not contemplate electroplating processing.

Figure 4:
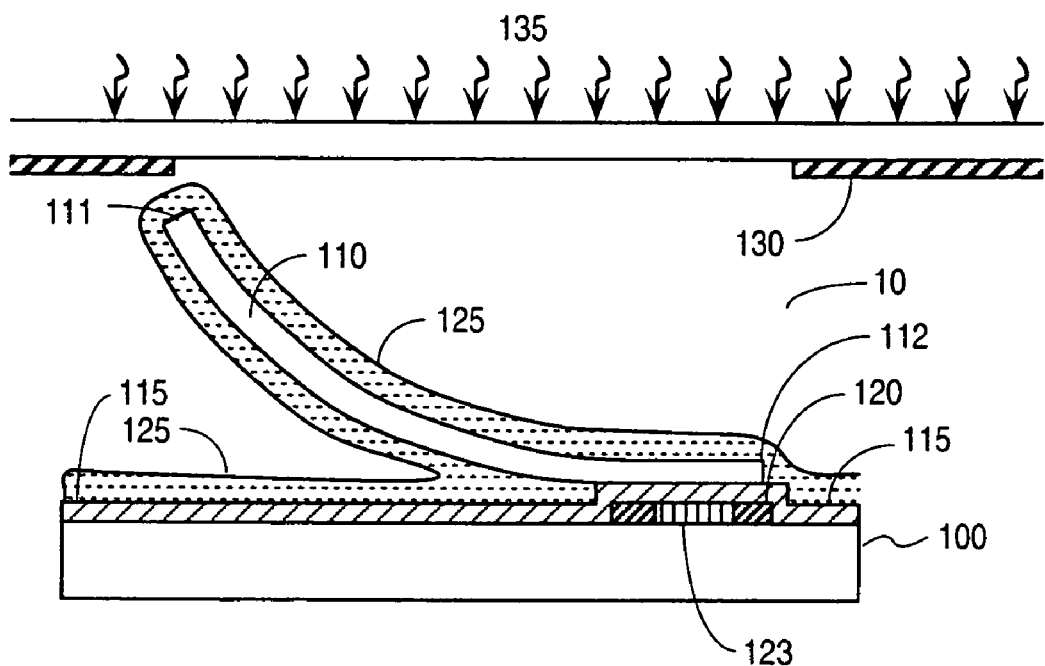
FIG. 4 shows the structure of FIG. 1 and the process of opening an area through the masking material layer to the interconnection element in accordance with an embodiment of the invention.
Figure 5:
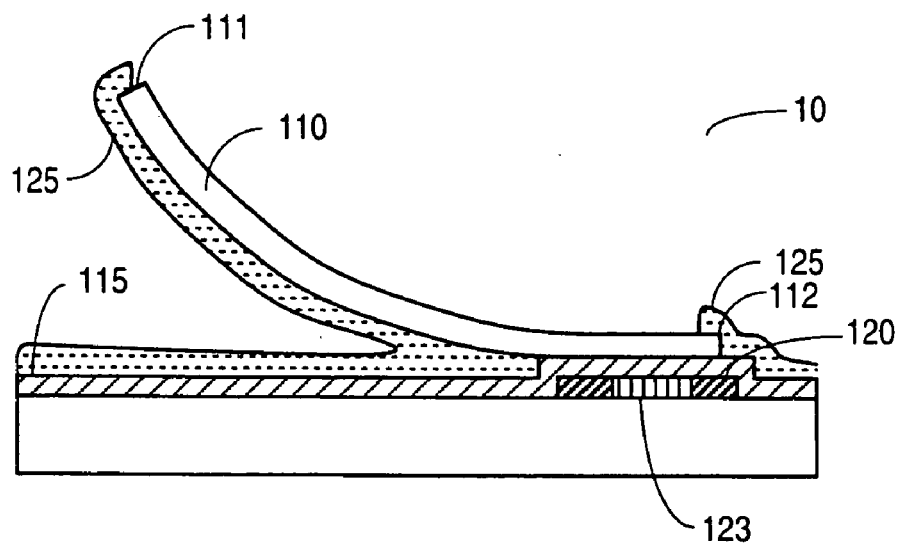
FIG. 5 shows the structure of FIG. 1 after an opening is formed to the interconnection element in accordance with an embodiment of the invention.

Once masking material layer 125 is deposited over substrate 100, FIG. 4 shows the patterning of masking material layer 125 to form an opening to interconnection element 110. In the case of a positive resist such as a positive electrophoretic resist, masking material layer 125 is exposed through an appropriate pattern 130 to ultraviolet light and developed. Exposed areas of masking material layer 125 are removed during developing and the remaining resist is hard-baked as known in the art. The resulting structure is illustrated in FIG. 5 having an opening through masking material layer 125 to expose a superior surface of interconnection element 110.

Figure 6:
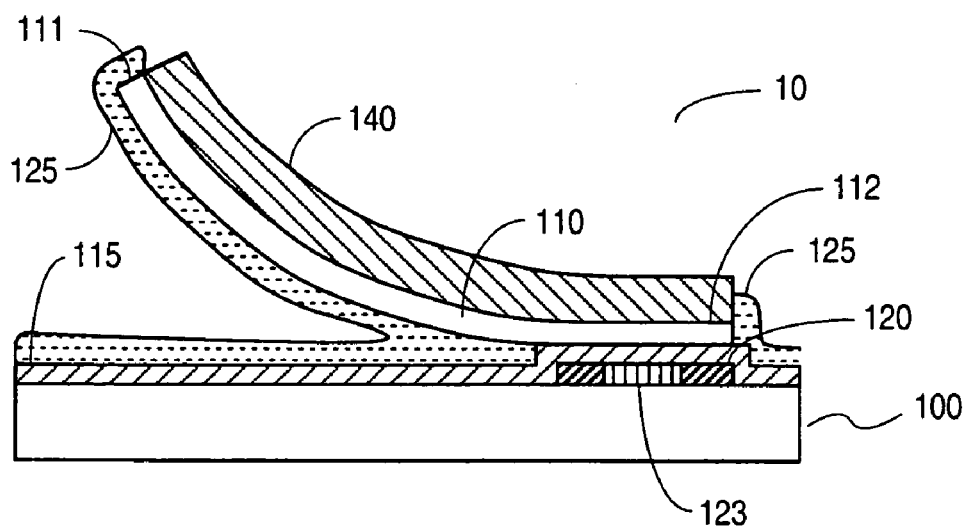
FIG. 6 shows the structure of FIG. 1 after the coupling of a spring material to the interconnection element through the opening in the masking material layer in accordance with an embodiment of the invention.

FIG. 6 shows the structure after the deposition of spring material 140 (a "second structure"). In one embodiment, spring material 140 is a conductive material of, for example, a nickel alloy such as nickel-cobalt (e.g., 70 percent nickel-30 percent cobalt). In one particularly preferred embodiment, spring material 140 is deposited from a bath that may also include an additive such as saccharin. Suitable spring materials, including suitable additives are discussed in detail in co-pending, commonly-assigned U.S. patent application Ser. No. 09/217,589, filed Dec. 22, 1998, titled "Method of Making a Product with Improved Material Properties by Moderate Heat Treatment of a Metal Incorporating a Dilute Additive," and the corresponding PCT Application No. WO/99/14404, published Mar. 25, 1999, which are incorporated herein by reference. Spring material 140 is a resilient material deposited to a thickness suitable for increasing the spring constant of underlying interconnection element 110. In one embodiment, spring material 140 is deposited to a predetermined thickness of, for example, about 1 mil (25 μm) in thickness. Collectively, interconnection element 110 and spring material 140 define an interconnection element having a predetermined spring constant greater than interconnection element 110 by itself (e.g., the spring constant generally depending in part on the dimensions of the interconnection element). In embodiments of interconnection elements useful in making electrical connections with, for example, contact pads or terminals of electronic components fabricated according to current technology, a spring constant of about 0.2 gram-force per mil or greater is suitable. It is to be appreciated that the desired spring constant may vary according to the desired application such as spring constants between about 0.01 and 10 gram-force per mil and preferably about 0.01 and 2 gram-force per mil. These parameters are only illustrative as one skilled in the art can make very thin or very thick structures with a wide range of spring constants.

In the embodiment where spring material 140 is a nickel alloy, such as nickel-cobalt, spring material 140 may be deposited by several deposition techniques, including but not limited to, electroplating, chemical vapor deposition, sputter deposition, and electroless plating. In one example, spring material 140 is deposited through an electroplating process. Spring material 140 is typically applied in the form of a commercially available electroplate solution or bath. Next, a current is applied between interconnection element 110 and an abode of an electroplating cell (not shown). Negative charge build-up on interconnection element 110 causes metal ions in the electroplating solution to be reduced to a metallic state, coating spring material 140 on interconnection element 110. It is to be appreciated that, in the example described, interconnection element 110 is a conductive material that may serve as a cathode for the described electroplating process. In an embodiment where interconnection element 110 is formed of a non-conductive material, spring material 140 is deposited, for example, by an alternative method such as noted above.

Figure 7:
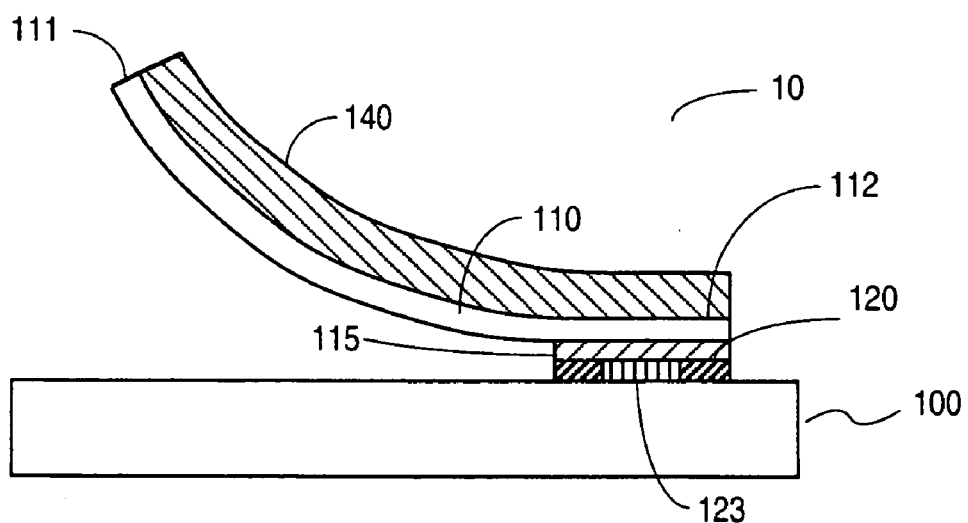
FIG. 7 shows the structure of FIG. 1 after the removal of the masking material layer to reveal an interconnection element according to an aspect of the invention.

In one aspect of the invention, the enhanced interconnection element comprises interconnection element 110 and spring material 140. Thus, FIG. 7 shows structure 10 after removal of masking material layer 125. In the embodiment where masking material layer 125 is a photoresist, masking material layer 125 may be removed using conventional methods, such as plasma etching (e.g., oxygen ashing), laser ablation, or wet chemical etching. At this point, conductive layer 115 may also be removed or patterned into appropriate traces via a solvent, etching agent, or mechanical means. FIG. 7 shows conductive layer 115 removed from portions of the substrate, e.g., portions generally accessible by removing agents.

With the addition of spring material 140, the composite interconnection element illustrated in FIG. 7 has an improved spring constant which generally allows the composite interconnection element to sustain a greater contact force than interconnection element 110 increasing its versatility in a variety of applications.

Figure 8:
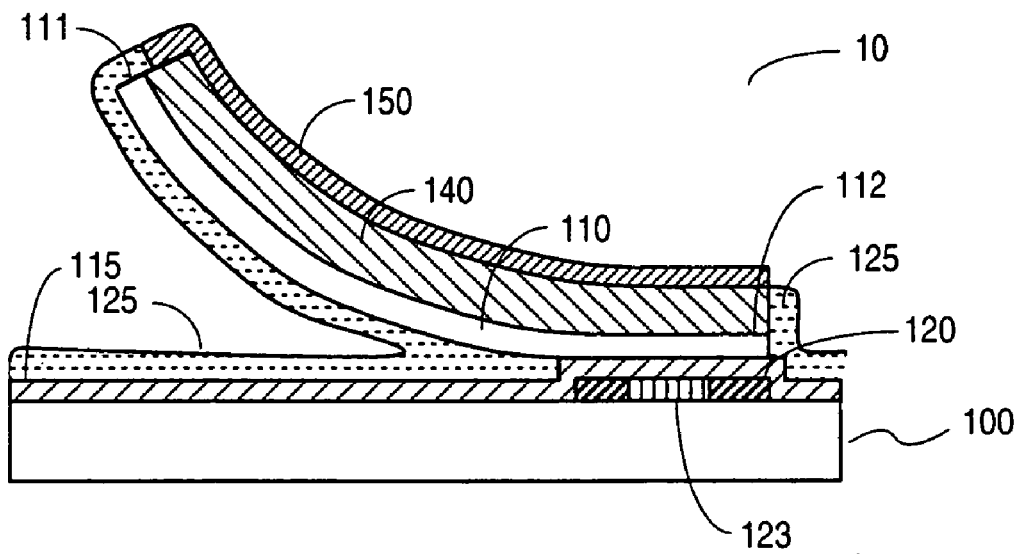
FIG. 8 shows the structure of FIG. 1 after the coupling of a probe material to the interconnection element through the opening in the masking material layer in accordance with an embodiment of the invention.

In another aspect of the invention, the interconnection is further enhanced by the introduction of additional material. Starting from the structure shown in FIG. 6, FIG. 8 shows the structure after the optional deposition through an electroplating process of probe material 150 to the superior surface of spring material 140. In one example, probe material 150 reduces the resistivity of spring material 140 and provides contact metallurgy to the interconnection structure that is formed. Suitable probe materials include gold (Au), rhodium (Rh), or a palladium-cobalt (Pd—Co) alloy. In one embodiment, probe material 150 is deposited to a thickness of approximately 30 micro-inches (7500-8000 Å) over the superior surface of spring material 140. It is to be appreciated that probe material 150 need not be deposited over the entire surface of spring material 140 but may be limited to an area corresponding with a contact region for the interconnection element.

Figure 9:
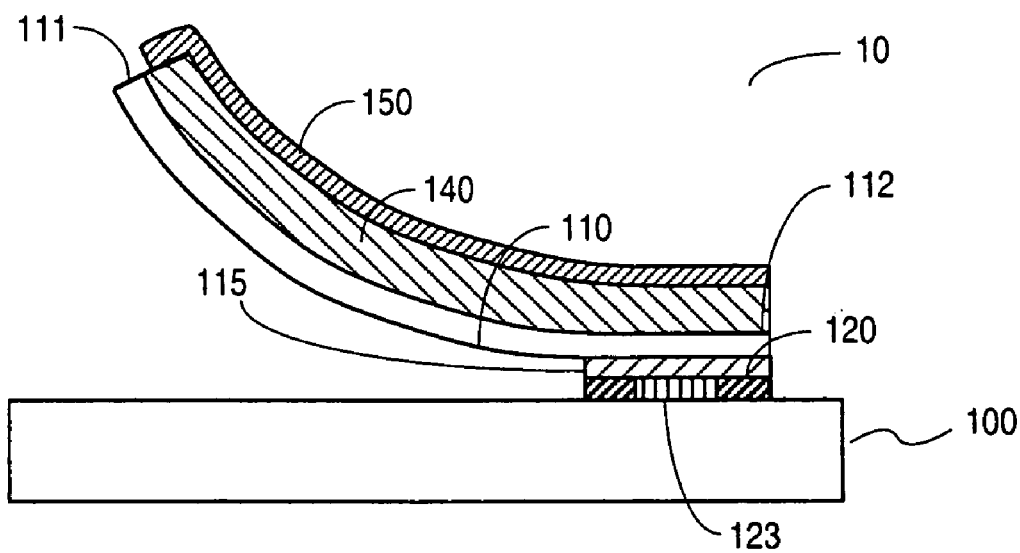
FIG. 9 shows the structure of FIG. 1 after the removal of the masking material layer in accordance with an embodiment of the invention.

FIG. 9 shows structure 10 after removal of masking material layer 125. In the embodiment where masking material layer 125 is a photoresist, masking material layer 125 may be removed using conventional methods, such as plasma etching (e.g., oxygen ashing), laser ablation, of wet chemical etching. At this point, conductive layer 115 may also be removed or patterned via a solvent, etching agent, or mechanical means.

In the embodiment described in this aspect, the enhanced interconnection element is a composite interconnection element comprised of interconnection element 110, spring material 140, and probe material 150. Similar to the discussion above with respect to FIG. 7, the enhanced interconnection element illustrated in FIG. 9 generally has improved mechanical properties over prior art structures such as interconnection element 110. The following processes illustrated in FIG. 10 and FIG. 11 further enhance the interconnection element described with respect to FIG. 9. It is to be appreciated that similar enhancements can be implemented as well as with the interconnection element of FIG. 7.

At this point, structure 10 may be subjected to an optional heat treatment that, in one aspect, relieves stress in interconnection element 110, particularly at its anchor portion to secure its fixation to substrate 100, and improves the mechanical properties of spring material 140. Details concerning an optional heat treatment are described in detail in co-pending, commonly-assigned U.S. patent application Ser. No. 09/217,589, filed Dec. 22, 1998, titled "Method of Making a Product with Improved Material Properties by Moderate Heat Treatment of a Metal Incorporating a Dilute Additive," and corresponding PCT Application No. WO 99/14404, published Mar. 25, 1999, incorporated herein by reference.

Figure 10:
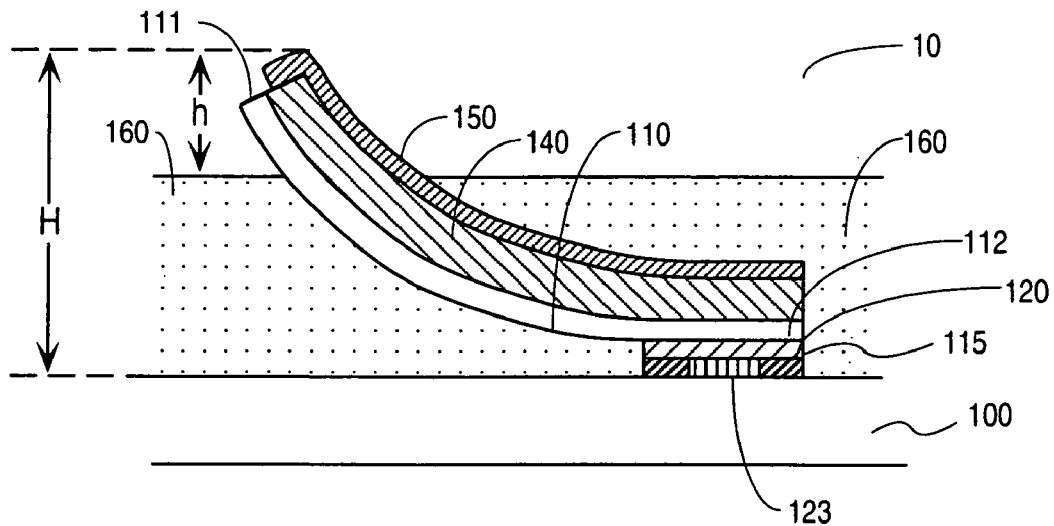
FIG. 10 shows the structure of FIG. 1 after the deposition of a travel stop material over the substrate in accordance with an embodiment of the invention.

FIG. 10 shows structure 10 after depositing travel stop material 160 over the structure. The fabrication and incorporation of various travel stops is described in co-pending, commonly-assigned U.S. patent application Ser. No. 09/032, 473, filed Jul. 13, 1998, titled "Interconnect Assemblies and Methods," and U.S. patent application Ser. No. 09/264,788, filed Jul. 30, 1999, titled "Interconnect Assemblies and Methods," both of which are incorporated herein by reference. The following description sets forth one example of a suitable travel stop for the composite interconnection element. It will be appreciated that other travel stops described in the referenced and incorporated documents will generally also be suitable.

Travel stop material 160 is incorporated to limit the travel of the composite interconnection element when making contact with, for example, a contact pad of an electronic component. In one embodiment, the height, H, of the tip of the composite interconnection element from the surface of substrate 100 is approximately 5-15 mils (250-400 μm). The maximum desired amount of deflection for the composite interconnection element, h, may be determined to be approximately 3 mils (76 μm). Thus, in one embodiment, travel stop material 160 is deposited to a thickness of approximately 2-12 mils (50-300 μm) to provide a height, h, of the composite interconnection element over travel stop material 160 of approximately 3 mils (76 μm). In one embodiment, travel stop material is a non-conductive material such as a photoimageable material such as SU-8 which is negative photoresist, commercially available from Micro-Chem Corporation of Newton, Mass. Other material for travel stop material 160 includes silicon nitride or silicon oxynitride.

Figure 11:
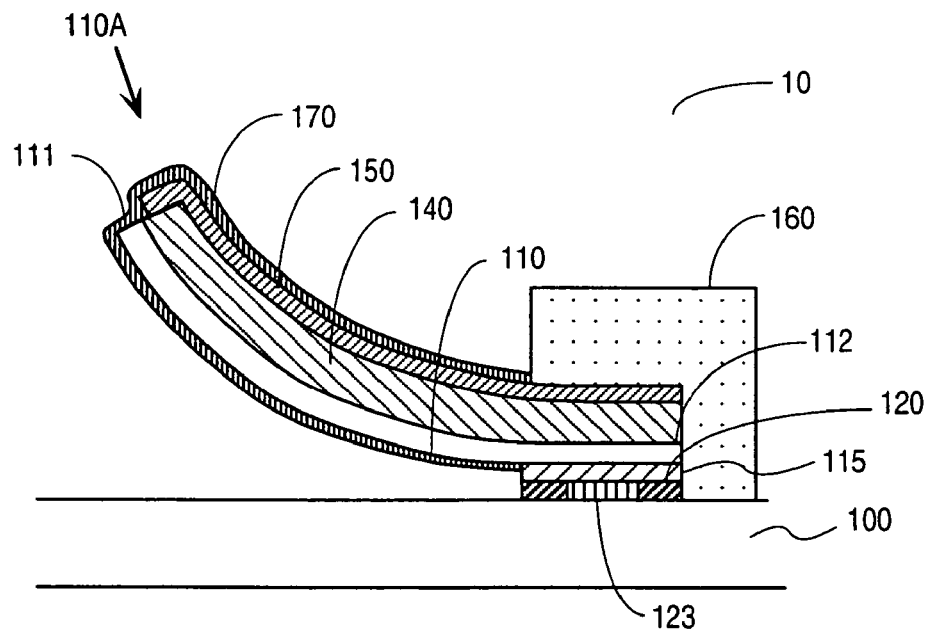
FIG. 11 shows the structure of FIG. 1 after the patterning of the travel stop and the optional step of coupling a contact material to the interconnection element in accordance with an embodiment of the invention.

After the proper amount of travel stop material 160 is introduced over substrate 100, travel stop material 160 is patterned. In the example of a negative photoresist, travel stop material 160 is exposed through a mask such that an area around anchor portion 112 is exposed. Because travel stop material 160 is a negative photoresist, those areas that did not receive an exposure due to the mask will be developed to remove the photoresist (and the exposed portions of the photoresist will remain). FIG. 11 shows structure 10 after patterning travel stop material 160 over a portion of substrate 100 including the anchor portion of composite interconnection element 110A. In this embodiment, travel stop material 160 will allow the deflection of composite interconnection element 110A towards substrate 100 with some limitation. For example, when a second electronic component is directed towards substrate 100, the electronic component will be stopped by travel stop material 160.

FIG. 11 also shows composite interconnection element 110A having an overcoating of a contact material, such as electroless or electroplated gold coated to a few microinches (a few thousand angstroms) to improve the electrical conduction properties (e.g., lower the resistance) of composite interconnection element 110A. It is to be appreciated that coating 170 is optional in this embodiment. In the instance of an electroplating process to introduce the overcoating a conductive layer such as conductive layer 115 may be retained until after the introduction, rather than removing or patterning it as described with regard to FIGS. 7 and 9, respetively.

Figure 12:
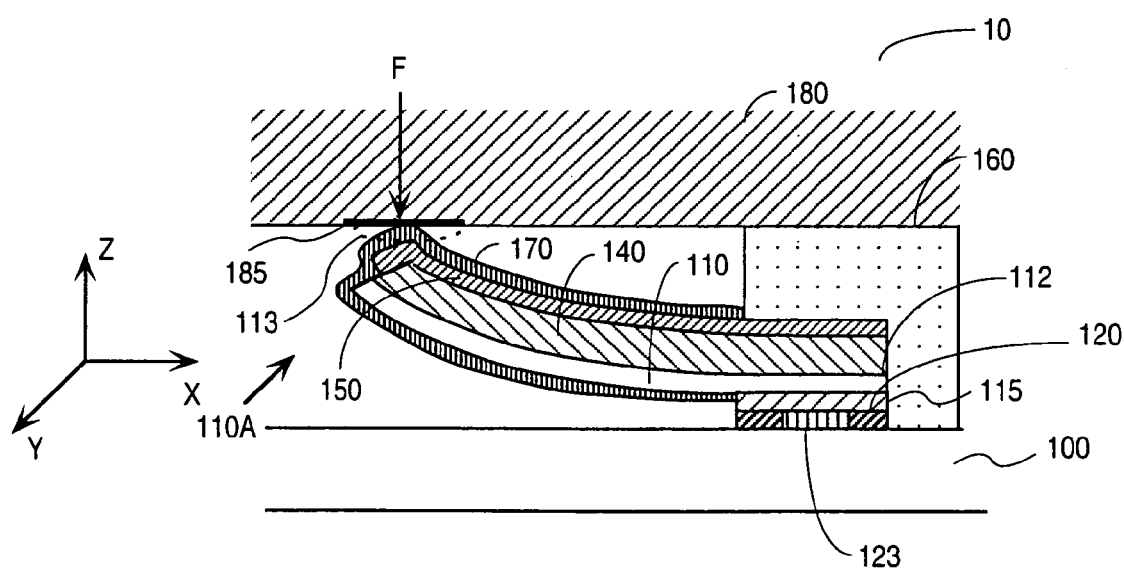
FIG. 12 shows an embodiment of an interconnection element of the invention making compliant contact with a contact pad or terminal of a second electronic component.

FIG. 12 shows composite interconnection element 110A formed according to the process described above in compliant contact with contact pad or terminal 185 of electronic component 180. Electronic component 185 is displaced in a z-direction toward substrate 100. Travel stop 160 limits the displacement and thus the deflection of composite interconnection element 110A. Contact region 113 of composite interconnection element 110A contacts contact pad or terminal 185 to establish the electrical contact.

The above described method relates to forming a composite interconnection element having improved strength characteristics over the core interconnection element that itself has some spring constant. A starting point was the interconnection element described in U.S. Pat. No. 5,613,861. It is to be appreciated that the invention is applicable to modifying the spring constant of a variety of interconnection elements. The invention is suitable for interconnection elements of various shapes and adopting a variety of orientations. One aspect of the invention seeks to improve the structural characteristics (e.g., spring constant) of a resilient core. In this manner, applications and reliability of the interconnection elements of the invention can be greatly improved.

In FIG. 12, composite interconnection element 110A is described as being compliant in the z-direction (i.e., a z-plane). It is to be appreciated that composite interconnection elements are readily engineered to be compliant in more than one plane, such as compliant in a z-plane as well as an x-y plane (parallel to the surface of substrate 100). Co-pending, commonly-assigned U.S. patent application Ser. No. 09/032,473, filed Feb. 26, 1998, titled "Lithographically Defined Microelectronic Contact Structures," for example, describes methods of forming interconnection elements having compliant properties in multiple planes. Such techniques, incorporated herein by reference, may be employed in conjunction with the techniques described herein to engineer composite interconnection elements with similar compliant properties.

The apparatus and method of this invention is useful in conjunction with formation of relevant structures on a sacrificial substrate. In commonly assigned U.S. Pat. No. 5,994,142, titled "Fabricating Interconnects and Tips Using Sacrificial Substrates," a plated structure is formed on a sacrificial substrate, then transferred to an electronic component. The sacrificial substrate is removed to free the plated structure. The remaining processing is more or less identical to that disclosed in the primary description above. At an appropriate stage of processing, the sacrificial layer is removed, as described in the above-referenced document.

The apparatus and method of this invention are useful in conjunction with transfer of a tip structure to the instant composite interconnection element. Referring, for example, to U.S. Pat. No. 5,829,128, and particularly to the discussion of FIGS. 8A through 8E (starting at column 37), a tip structure can be formed on a sacrificial substrate, then secured to the composite interconnection element (rather than the interconnection element 832 of that patent) in much the same method described in that patent. The planarizing step shown in FIG. 8C (column 38, line 59) is useful but optional in one preferred implementation. See also co-pending, commonly assigned U.S. patent application Ser. No. 08/819,464, titled "Contact Tip Structures for Microelectronic Interconnection Elements and Methods of Making Same," filed Mar. 17, 1997, for other examples of useful tip structures.

Figure 13:
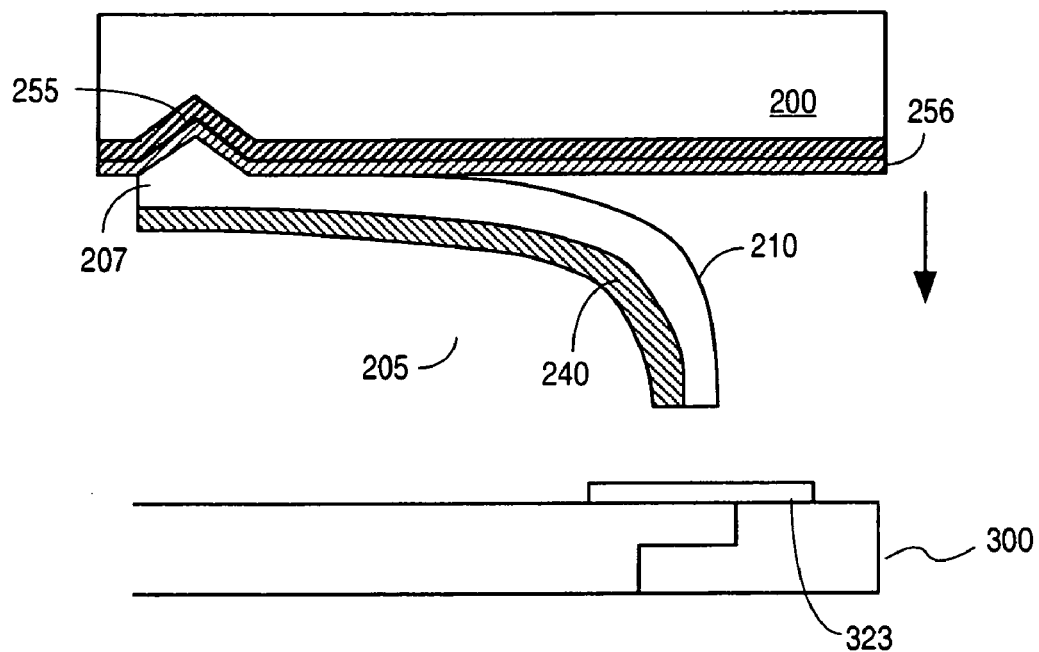
FIG. 13 shows an interconnection element structure formed on a sacrificial substrate in accordance with another embodiment of the invention and aligned with a second substrate.
Figure 14:
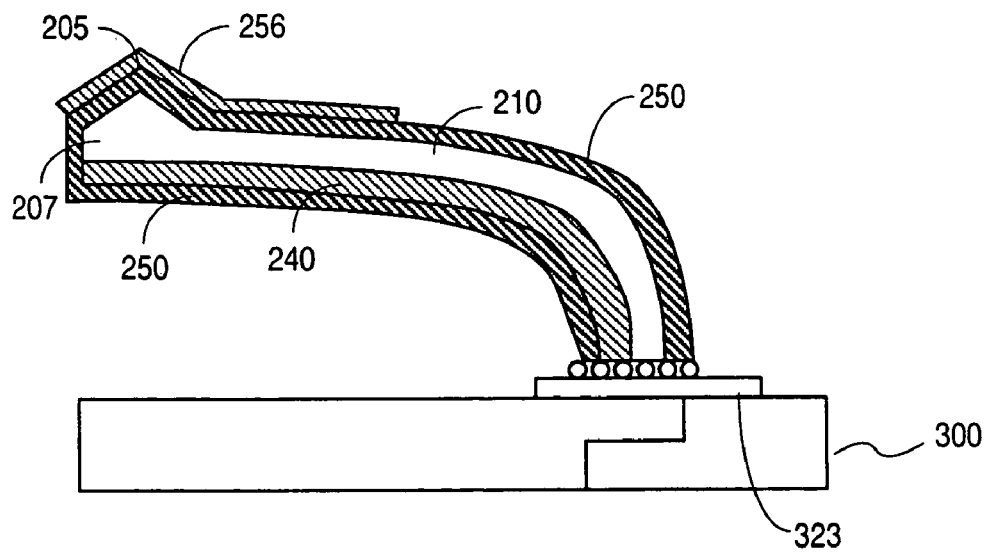
FIG. 14 shows the representation of FIG. 13 after the transfer of the interconnection element structure to the second substrate.
Figure 15:
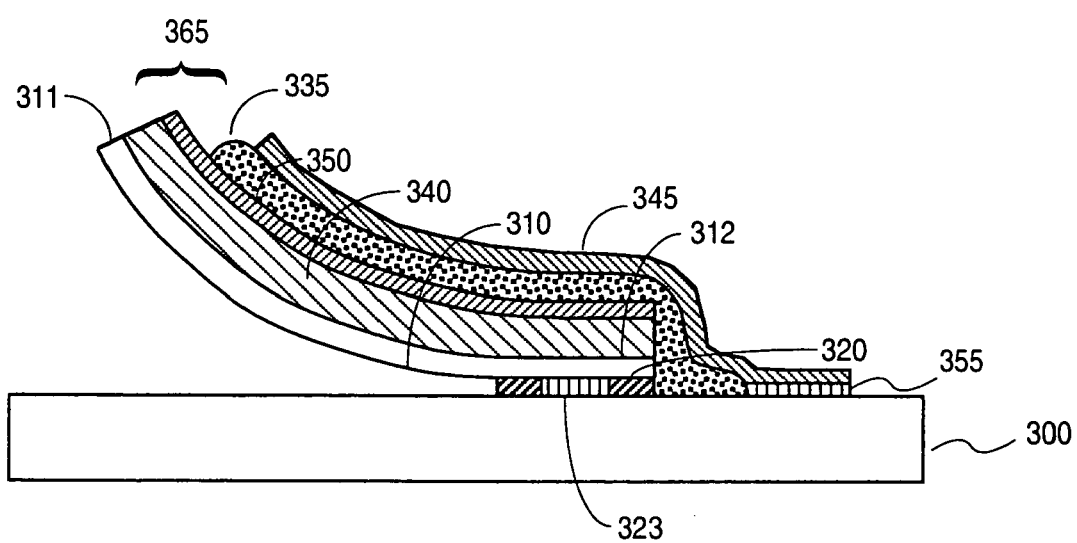
FIG. 15 shows an interconnection element structure coupled to a substrate and having a multi-layered shell in accordance with another embodiment of the invention.

In a similar manner, the composite interconnection element of this invention can be formed using a sacrificial component in place of directly forming the interconnection element on substrate 100. FIG. 13 and FIG. 14 illustrate a sequence where an interconnection element is formed on a sacrificial substrate and transferred to a second substrate. FIG. 13 shows sacrificial substrate 200 having interconnection element 205 formed therein. For purposes of illustrating the interaction between sacrificial substrate 200 and a second substrate, sacrificial substrate 200 is illustrated as inverted. Interconnection element 205 includes first element portion 210 of a material with a spring constant similar to the spring constant of interconnection element 110 described above. First element portion 210 includes contact region or tip portion 207 formed in substrate 205. Methods of forming contact region 207 are described in U.S. Pat. No. 5,829,128, and co-pending, commonly assigned U.S. patent application Ser. No. 08/819,464, titled "Contact Tip Structures for Microelectronic Interconnection Elements and Methods of Making Same," filed Mar. 17, 1997, incorporated herein by reference. Alternatively, a contact region of a tip structure may be fabricated separately and affixed to the interconnection element as noted in U.S. Pat. No. 5,829,128.

One way to create a structure wherein an unaffixed portion curves away from substrate 200 is to introduce first element portion 210 over a masking material layer and then grind, through a mechanical or chemical-mechanical polish, first element portion 210 to the desired shape (e.g., a portion substantially parallel to substrate 205). A second way that the shape of first element portion 210 can be formed is forming first element portion 210 over a sloped mask. There are numerous techniques known in the art for creating a slope on, for example, a photoresist. One method involves the use of a gray-scale mask having a gradient of opacity from clear to black. Other methods include: gently reflowing the masking material to form a slope; controlling the light exposure intensity or time to the masking material; during exposure, varying the distance of the mask from the masking layer; exposing the masking layer two or more times, one through the mask having a small transparent area and separately with a mask having a larger transparent area; or combinations of these methods. Methods for forming a tapered mask are described in co-pending, commonly-assigned U.S. patent application Ser. No. 09/032,473, filed Feb. 26, 1998, titled "Lithographically Defined Microelectronic Contact Structures," incorporated herein by reference.

In the embodiment described, second element portion 240 of spring material similar to spring material 140 described above is introduced over first element portion 210. A comparison to the composite structure shown above in reference to FIG. 5 and FIG. 6 and the accompanying text, shows that second element portion 240 is introduced, in this embodiment, on the "underside" of first element portion 210.

Interconnection element 205 is coupled to sacrificial substrate 200 at an opening in sacrificial substrate 200. Interconnection element 205 is coupled through release layer 255 such as aluminum, copper, or titanium-tungsten deposited to a thickness of approximately 5000 Å. Overlying release layer 255 may be conductive layer 256 such as copper to facilitate the introduction of first element portion 210 by way of an electroplating process.

FIG. 13 shows sacrificial substrate 200 aligned with substrate 300 that is, for example, an electronic component similar to the example described in reference to substrate 100 and having contact pad or terminal. 323 formed on a surface. FIG. 14 shows substrate 300 after coupling interconnection element 205 to contact pad or terminal 323. In one embodiment, interconnection element 205 is affixed at one end to contact pad or terminal 323 by soldering or brazing then separated at release layer 255 from sacrificial substrate 200. In the example where release layer 255 is aluminum, a sodium hydroxide (NaOH) solution may be used to separate interconnection element 205. In the case of a release layer of copper, an etch selective for copper may be used to separate interconnection element 205 from release layer 255. A grinding procedure may be necessary at this point to planarize a superior surface of first element portion 205 (and any remaining conductive layer 256).

Third element portion 250 similar to probe material 150 (FIG. 11) may then be introduced over first element portion 110 by, for example, electroless plating. A travel stop and contact material overcoat may be incorporated following a similar procedure as discussed above with reference to FIGS. 10 and 11 and the accompanying text.

The apparatus and method of this invention can be formed in a way to provide controlled impedance nearly to the contact region of the composite interconnection element. A useful controlled impedance structure is described in U.S. Pat. No. 5,829,128 at column 17, line 35, and illustrated in FIG. 2B of that patent. A comparable controlled impedance structure is described in U.S. Pat. No. 5,917,707 and illustrated in FIG. 12 of that patent. These patents list useful materials and processing techniques for such structures.

An analogous structure can be formed using the instant composite interconnection element as illustrated in FIG. 13.

In FIG. 13, contact pad 323 is analogous to contact pad 123, insulating layer 320 to insulating layer 120, interconnection element 310 to interconnection element 110, spring material 340 to spring material 140, and probe material 350 to probe material 150, described above with reference to FIG. 7 and the accompanying text. Beginning, in one embodiment, referring to FIG. 13, from the structure illustrated in FIG. 7, insulating material 335 is applied over some portion of the composite interconnection element, and conducting material 345 is applied over some portion of insulating material 335. In a preferred embodiment, insulating material 335 is applied over probe material 350. Insulating material 335 can be, for example, PARALENE® (commercially available from E.I. DuPont de Nemours Co. of Wilmington, Del.) or other suitable insulating material introduced to a suitable thickness of, for example, 0.1-3 mils. Insulating material 335 is selectively applied so as not to preclude electronic connection of the interconnection or conducting material 345. Conducting material 345 may be applied in a variety of methods. In one preferred embodiment, conducting material 345 is applied by sputtering. In one preferred embodiment, conducting material 345 is gold. Conducting material 345 is in contact with trace 355, which in turn is connected to a suitable voltage level. In one preferred embodiment, trace 355 is held at ground. A plurality of such conducting material 345 elements can be connected together, and different pluralities may be held at the same or different voltage levels. The exact dimensions of conducting material 345 can be selected by one skilled in the art. One useful shape of conducting material 345 is approximately identical in top view to the top view of the composite interconnection element except for exposed contact region 365. Conducting material 345 can partially or even completely surround the interconnection element, provided that sufficient insulation is provided and that contact region 365 remains exposed to establish a connection.

One useful variant of this structure is to have the interconnection element described above with reference to FIG. 7 provide the mechanical support only, and have conducting material 345 carry an electrical connection of interest. In this case, the interconnection element would be held to a suitable voltage level and conducting material 345 would carry the electrical connection of interest, such as a signal, clock, data, address, control, or power for a given interconnection. In this embodiment, insulating material 335 could entirely cover the interconnection element. Contact region 365 would be part of conducting material 345 rather than part of the interconnection element described above with reference to FIG. 7.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method of forming an interconnection element comprising: forming a free-standing first structure coupled at a first end to a first substrate, a second end of the free-standing first structure spaced away from the substrate and being free to flex toward the substrate, the first structure comprising a first material and having a first spring constant;

applying a masking material to the free-standing first structure while the first structure is free standing with the second end spaced away from the substrate and free to flex toward the substrate; and coating on the free-standing first structure a second structure of a second material through an opening in the masking material on the first structure, the first structure and the second structure comprising the interconnection element and the interconnection element having a spring constant greater than the spring constant of the first structure.

2. The method of claim 1, wherein coating the second structure comprises overlying a portion of the first structure.

3. The method of claim 1, wherein the substrate is a first substrate, the method further comprising transferring the interconnection element from the first substrate to a second substrate.

4. The method of claim 1, wherein creating the free-standing first structure further comprises forming a pre-release structure having a base coupled to the structure and a free end extending over a portion of the substrate; and releasing the free end from the first substrate to form a cantilever.

5. The method of claim 1, further comprising transferring the interconnection element to a second substrate.

6. The method of claim 1, wherein the masking material is an electrophoretic resist.

7. The method of claim 1, wherein the first spring constant is sufficient for repeated elastic displacement of the first structure without substantial plastic deformation of the first structure.

8. The method of claim 1, further comprising using the interconnection element to test an electronic component.

9. The method of claim 1, further comprising removing the masking material.

10. The method of claim 1, further comprising coupling a probe material to the second material through the opening of the masking material.

11. The method of claim 10, further comprising removing the masking material.

12. The method of claim 1, further comprising fabricating a travel stop for the interconnection element.

13. The method of claim 1, further comprising depositing an overcoating of contact material over the interconnection element.

* * * * *